United States Patent [19]

Turner

[11] Patent Number: 4,745,287

[45] Date of Patent: May 17, 1988

[54] ION IMPLANTATION WITH VARIABLE IMPLANT ANGLE

[75] Inventor: Norman L. Turner, Gloucester, Mass.

[73] Assignee: Ionex/HEI, Newburyport, Mass.

[21] Appl. No.: 922,319

[22] Filed: Oct. 23, 1986

[51] Int. Cl.⁴ .............................................. H01V 37/20
[52] U.S. Cl. ................................ 250/492.2; 250/442.1
[58] Field of Search .............. 250/492.21, 442.1, 492.2

[56] References Cited

U.S. PATENT DOCUMENTS

| | | | |
|---|---|---|---|
| 3,778,626 | 12/1973 | Robertson | 250/492.21 |
| 4,035,655 | 7/1977 | Guernet et al. | 250/492.21 |
| 4,405,864 | 9/1983 | del Rio | 250/492.21 |
| 4,553,069 | 11/1985 | Purser | 250/492.21 |

Primary Examiner—Carolyn E. Fields
Assistant Examiner—Jack I. Berman
Attorney, Agent, or Firm—Henry C. Nields

[57] ABSTRACT

A target holder for an ion implantation system is disclosed. The targets are supported on a disk which is mounted on a motor which spins the disk. The motor is in turn mounted on a shaft which makes a reciprocating scanning movement along its axis. The spinning of the disk and the reciprocation of the shaft provide uniform exposure of the targets to the incident ion beam. In addition, the shaft can be rotated about its axis to control the angle of incidence of the ion beam as it strikes the targets.

2 Claims, 4 Drawing Sheets

ION IMPLANTATION WITH VARIABLE IMPLANT ANGLE

BACKGROUND OF THE INVENTION

1. Field of the Invention

The present invention relates to the implantation of ions into semiconductor materials, and in particular to apparatus in which the materials into which ions are to be implanted are supported upon a spinning disk during ion implantation.

2. Description of the Prior Art

In processing semi-conductors and, in particular, in processing of crystalline wafers by ion implantation, it is necessary to be careful to avoid the effects of so-called "ion channelling". Ion channelling is a well-known phenomenon which occurs whenever the angle of the trajectory of the incoming ion beam with respect to the normal to the surface of the semiconductor upon which the ion beam impinges (i.e., the "angle of incidence") is less than a critical angle. If the angle of incidence is near this critical angle, the ion trajectories into the material are far deeper than desired, and are deeper than the trajectories obtained through normal random distribution caused by scattering through the crystal lattice. For some purposes ion channelling is desired, and for such purposes the channelling effect is intentionally used by causing the ion beam to enter the crystal lattice along the normal axis. For other purposes random distribution is desired, and this usually occurs when the angle of incidence is varied to some angle between 3 and 10 degrees off the normal axis.

In the past, ion implantation equipment utilized various techniques for permitting adjustment of the implant angle. More recently, several machines have been designed in which silicon wafers have been fixed by clamps around the perimeter of a metal disc, which is then spun and moved across the path of a stationary ion beam for ion implantation processing of the wafers. The disk is spun to a typical speed of 500-1500 revolutions per minute (rpm). The spinning of the disk moves the wafers at high speed through the ion beam in one direction. Relative movement between the wafers and the ion beam in a direction transverse to said one direction is produced either by imparting a slow scanning movement to the beam across the wafers, or by imparting a slow scanning movement to the spinning disk. One such spinning-disk arrangement is disclosed in U.S. Pat. No. 3,778,626 to Robertson. In these past arrangements, implant angle (i.e. the angle of incidence between the surface of the wafer and the beam) has only been variable by changing the angle of the mounting platen or surface upon which the wafer is mounted. This is usually done by unbolting the flat disk-shaped surfaces which had provided zero-degree or normal incidence, and bolting them to an angled disk platen which slants the wafer mounted thereon up to some implant angle, typically 7 degrees.

Another method which has been used is to tilt the entire spinning disk with respect to the beam. This is usually done by tilting the chamber to which the disk is attached.

Another matter which must be considered when changing the implant angle is the effect of such a change on the beam measurement system if the ion beam measurement system is integral with the disk. In such an arrangement, in order to provide variable implant angle during the implant process, one must accommodate both the ability to change the angle of incidence of the beam upon the wafer as well as the ability to change the position or maintain the relative position between the dose measuring system and the disk.

SUMMARY OF THE INVENTION

The invention makes use of the aforementioned arrangement, in which the rotating disk is positioned so that the incident ion beam strikes it at the desired point. In the usual arrangement the ion beam is horizontal, and so the rotating disk will lie in a vertical plane. The disk is dish-shaped, having a central circular region surrounded by a gently tapered peripheral region upon which the wafers are positioned. If the inner surface of the disk be regarded as a clock face, the ion beam preferably impinges on the peripheral region of the disk at the nine-o'clock or the three-o'clock position.

In accordance with the invention, the disk is mounted on the shaft of a motor which drives the shaft so as to rotate it, thereby rotating the disk. Preferably the ion beam and the shaft occupy a common horizontal plane, and the disk is aligned with respect to the ion beam so that, in this horizontal plane, the ion beam impinges on the disk at an angle normal thereto. However, for reasons to be explained hereinafter, the angle between the ion beam and the disk in the vertical plane which includes the ion beam will differ from an angle normal to the disk, and can be varied in accordance with the invention.

The motor is mounted in a housing which is supported by a hollow shaft which can be rotated about its own axis. If the hollow support shaft is in the aforementioned horizontal plane, normal incidence of the beam upon the disk in that horizontal plane is preserved despite such rotation. However, the angle of incidence of the beam upon the disk in the aforementioned vertical plane varies as the shaft is rotated. Thus, from the viewpoint of solid geometry, the angle of incidence of the ion beam upon the disk can be varied, even during irradiation.

The disk is rotated at a relatively high rate, while a scanning motion is imparted to the hollow support shaft in the direction of its axis. Proper adjustment of the speed of scan results in uniform and proper irradiation of all the wafers supported on the rotating disk.

DESCRIPTION OF THE PREFERRED EMBODIMENTS

Figure 1:
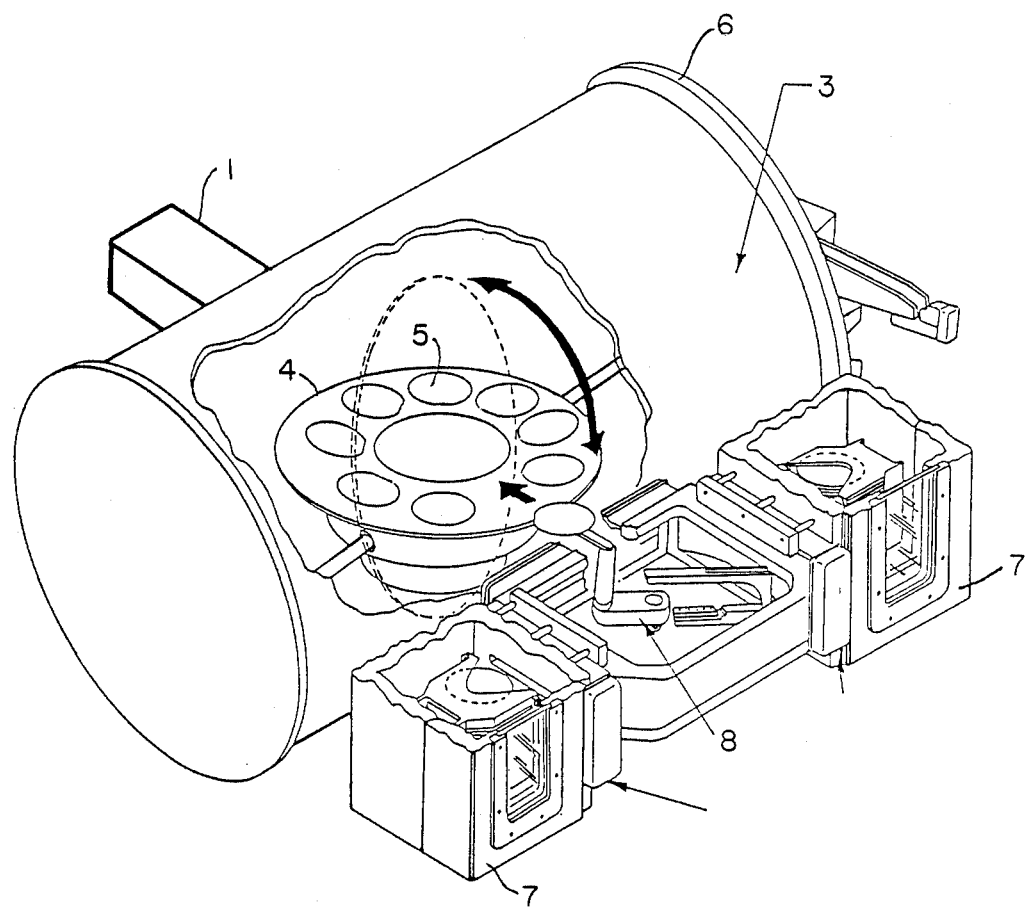
FIG. 1 is an isometric view of ion implantation apparatus having incorporated therein apparatus according to the present invention, showing the wafer support disk in the load position.

Referring to the drawings, and first to FIG. 1 thereof, therein is shown ion implantation apparatus of the type shown, for example, in U.S. Pat. No. 4,553,069 to Purser. However, the wafer support in the apparatus of FIG. 1 is quite different from that shown in said U.S.

patent, and embodies the principles of the present invention.

The ion implantation apparatus of FIG. 1 includes means 1 for producing an ion beam 2 and an end station chamber 3. A wafer support disk 4 is adapted to support a plurality of wafers 5 into which ions are to be implanted. In order to carry out the ion implantation process, the wafer support disk 4 is moved into the end station chamber 3, and the end station chamber 3 is sealed off from the atmosphere by closing the cover 6. The interior of the end station chamber 3 is then evacuated by means of a vacuum pump (not shown) to an appropriate vacuum. Various wafers which have been stored in two cassettes 7 are transported to the surface of the wafer support disk 4 by means of a suitable robot-arm device 8. The wafers occupy the positions shown in FIG. 1.

The wafer support disk 4 is mounted on a motor 9 which in turn is mounted on a rotatable shaft 10 which is capable of movement along its axis as well as rotation about its axis. In preparation for ion implantation, the motor 9 is activated so as to spin the wafer support disk 4 at a suitable speed. The periphery of the wafer support disk 4 has a dished shape, and stops (not shown) are provided upon the wafer support disk 4 so as to restrain the wafers 5 from leaving the wafer support disk 4 due to centrifugal force. The wafer support disk 4 may then be tilted into an essentially vertical position (i.e. the implant position) by rotation of the shaft 10. Because of the dished shape, centrifugal force on the wafers 5 produced by the spinning motion prevents the wafers 5 from falling off the wafer support disk 4 when it is in the implant position. An alternative arrangement could captivate the wafers via clamping rings or pins on a flat disk.

Figure 2:
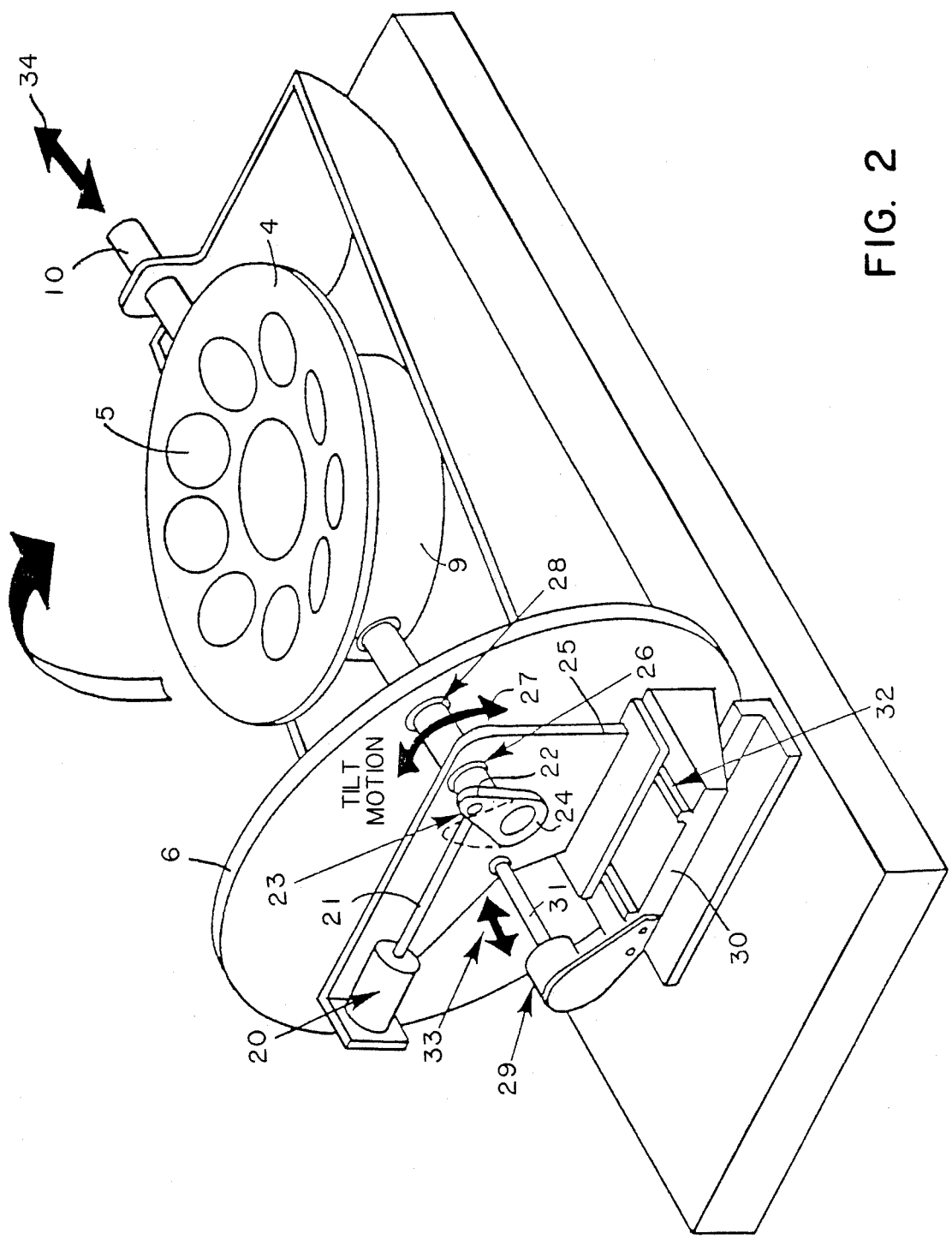
FIG. 2 is an isometric view on an enlarged scale of the wafer support disk of the apparatus of FIG. 1 in the load position.

The various possible movements of the wafer support disk 4 are shown in FIG. 2. The positioning of the wafer support disk 4 between the load position and the implant position is accomplished by a tilt actuator 20 which imparts translational movement to a rod 21 along its axis. The rod 21 is attached to the outer extremity 22 of tilt arm 23 having an apertured base 24 adapted to receive and be affixed to the shaft 10. Thus the shaft 10 acts as an axis for the tilt arm 23, so that the translational movement of the rod 21 is converted to rotational movement of the tilt arm 23 and the shaft 10. The tilt actuator 20 is mounted on a support plate 25 which includes a captive tilt bearing 26 which provides the mechanical support for the shaft 10. The tilt motion is shown be the double-headed arrow 27. The shaft 10 also passes through a sliding seal 28 in the cover 6 in order that the translational scan movement of the shaft 10 may take place without movement of the cover.

Scanning movement is imparted by a scan actuator 29 which is mounted on a shelf 30 affixed to the cover 6. The scan actuator 29 is similar to the tilt actuator 20 in that it imparts translational movement to a rod 31 which in turn is affixed to the plate 25. The relatively slow movement of the rod 31 moves the entire plate 25 back and forth along scan motion slides 32 on the shelf 30. Thus the entire plate 25 and the parts supported thereon are moved in a direction shown by the scan motion double-headed arrow 33. This scan motion is thus imparted to the shaft 10 as shown by the double-headed arrow 34.

The ion beam 2 is now activated. The relative position of the ion beam 2 and the wafer support disk 4 is such that the ion beam 2 penetrates the wafers 5 in such a position that, if the ion beam 2 were able to pass through the wafer support disk 4 entirely, it would pass through the axis of the shaft 10, as is shown more clearly in FIG. 3.

Figure 3:
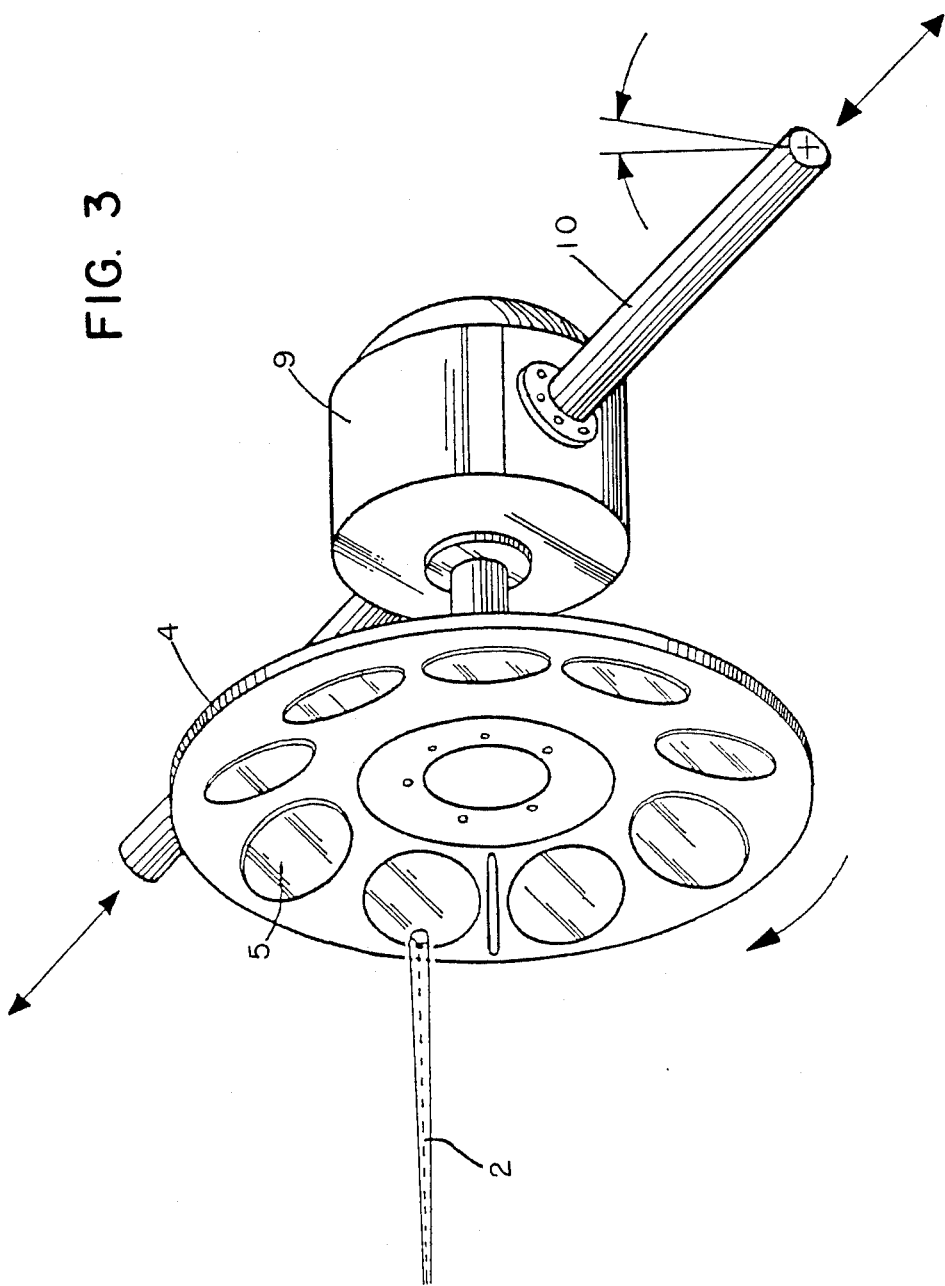
FIG. 3 is an isometric view of a portion of the apparatus of FIG. 2, showing the wafer support disk in the implant position.

Referring to FIG. 3, if the side of the wafer support disk 4 which is therein visible be regarded as a clock face, the ion beam would strike the wafer support disk 4 at the nine-o'clock position. During ion implantation, the shaft 10 is translated along its axis in a scanning motion, so that the combination of rapid spin and slow scan causes uniform irradiation of all the wafers.

Figure 4:
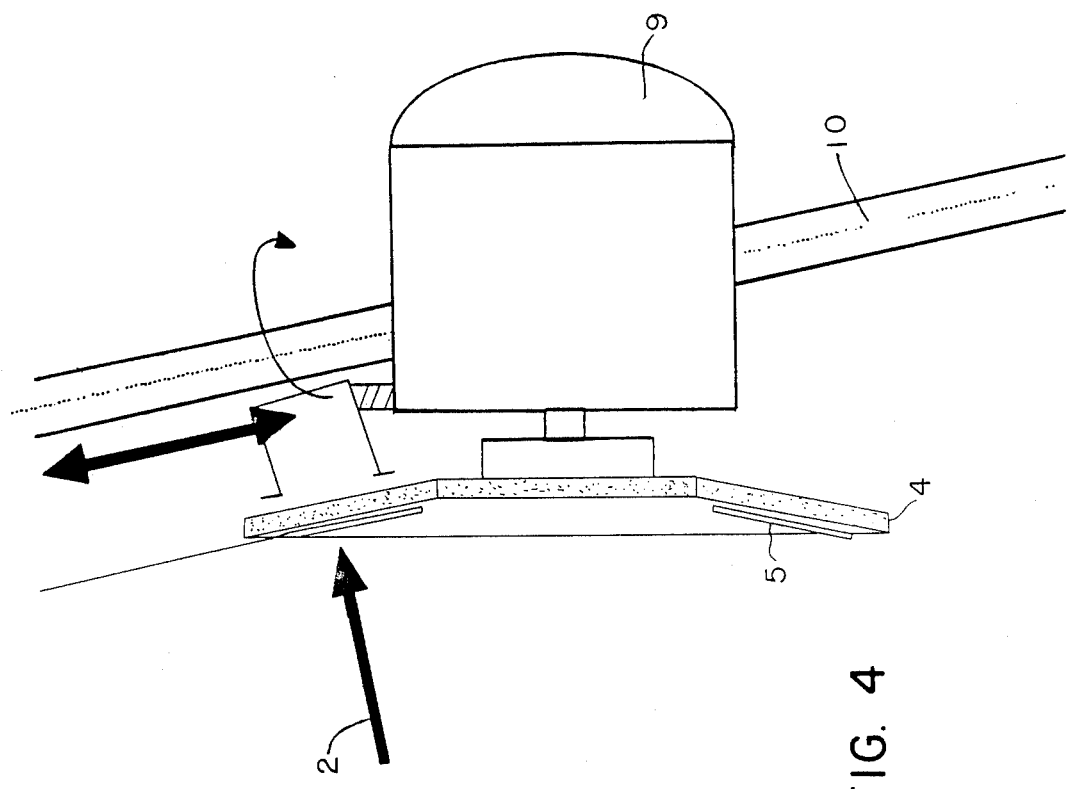
FIG. 4 is a horizontal central section through the wafer support apparatus of the present invention.

As is shown more clearly in FIG. 4, the incident ion beam 2 strikes the wafers 5 at an angle which is perpendicular to the plane of the wafer 5 in the horizontal dimension. However, as shown in FIG. 3, the angle at which the ion beam 2 strikes the wafers 5 in the vertical dimension may be varied from perpendicular to the plane of the wafer 5 to any desired angle deviating therefrom. This adjustment of the implant angle is accomplished, in accordance with the invention, simply by rotation of the shaft 10. Thus the implant angle may be adjusted simply, and may even be adjusted during the implantation process.

Having thus described the principles of the invention, together with an illustrative embodiment thereof, it is to be understood that although specific terms are employed, they are used in a generic and descriptive sense, and not for purposes of limitation, the scope of the invention being set forth in the following claims.

I claim:

1. Ion implantation apparatus in which the implant angle may be varied during implantation comprising, in combination,
    means for producing an ion beam, a wafer support comprising a spinning disk and adapted to support one or more wafers in the path of said ion beam in such a manner that the implant angle in one dimension is fixed during the implantation process, and
    means for imparting a scanning movement to said spinning disk along a scan axis transverse to the axis of spin of said spinning disk, and
    means for rotating said spinning disk about said scan axis so as to control and vary said implant angle in a dimension transverse to said one dimension.

2. Ion implantation apparatus in which the implant angle may be varied during implantation comprising, in combination,
    means for producing an ion beam,
    a wafer support comprising a spinning disk and adapted to support one or more wafers in the path of said ion beam in such a manner that the implant angle in one dimension is fixed during the implantation process,
    a rotatable shaft capable of movement along its axis,
    a motor mounted on said shaft,
    means for mounting said wafer support disk upon said motor so as to be spun thereby,
    means for imparting a scanning movement to said shaft along its axis, and
    means for rotating said shaft so as to control and vary said implant angle in a dimension transverse to said one dimension.

* * * * *